(12) United States Patent
Frey et al.

(10) Patent No.: US 7,741,849 B2
(45) Date of Patent: Jun. 22, 2010

(54) METHOD FOR PREDICTING THE RESIDUAL SERVICE LIFE OF AN ELECTRIC ENERGY ACCUMULATOR

(75) Inventors: Bernd Frey, Kirchheim (DE); Eberhard Schoch, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 728 days.

(21) Appl. No.: 10/561,724

(22) PCT Filed: Jun. 19, 2004

(86) PCT No.: PCT/DE2004/001287
§ 371 (c)(1),
(2), (4) Date: May 4, 2006

(87) PCT Pub. No.: WO2005/003799
PCT Pub. Date: Jan. 13, 2005

(65) Prior Publication Data
US 2006/0250137 A1    Nov. 9, 2006

(30) Foreign Application Priority Data
Jun. 25, 2003  (DE) ................ 103 28 721

(51) Int. Cl.
G01N 27/416   (2006.01)
(52) U.S. Cl. .................................. 324/427
(58) Field of Classification Search .......... 324/427, 324/428, 429, 433, 436; 320/132
See application file for complete search history.

(56) References Cited
U.S. PATENT DOCUMENTS 4,390,841 A * 6/1983 Martin et al. ............ 324/427
4,678,998 A * 7/1987 Muramatsu .............. 324/427
5,656,919 A   8/1997 Proctor et al.
5,808,445 A   9/1998 Aylor et al.
6,103,408 A   8/2000 Richter
2003/0054229 A1 * 3/2003 Odaohhara et al. ......... 429/61

FOREIGN PATENT DOCUMENTS

| DE | 37 12 629 | 10/1987 |
| DE | 197 50 309 | 5/1999 |
| DE | 100 49 495 | 4/2002 |
| DE | 102 03 810 | 1/2003 |
| DE | 103 01 823 | 7/2004 |
| EP | 0 560 468 | 9/1993 |
| EP | 1 120 663 | 8/2001 |
| WO | 2004 070407 | 8/2004 |

* cited by examiner

Primary Examiner—Bao Q Vu
Assistant Examiner—Jue Zhang
(74) Attorney, Agent, or Firm—Kenyon & Kenyon LLP

(57) ABSTRACT

Methods for predicting a remaining lifetime of an electric energy storage mechanism, in particular a battery in a motor vehicle and devices for implementing such methods are described in which the remaining lifetime is determined by extrapolation with the help of a mathematical model of the energy storage mechanism. This remaining lifetime is defined as the time until reaching any definable limiting values for the minimum efficiency or minimum storage capacity. The remaining lifetime is indicated and, when the level falls below a preselectable threshold, a warning is displayed. The parameters of the energy storage mechanism are adapted continuously to the real values over the lifetime. The anticipated remaining lifetime is determined by extrapolation from the values for the efficiency and/or storage capacity, based on a specifiable charge state and temperature and the minimum values required for the particular application, these values being calculated at regular intervals on the basis of the model and saved.

9 Claims, 2 Drawing Sheets

Structure of the lifetime predictor

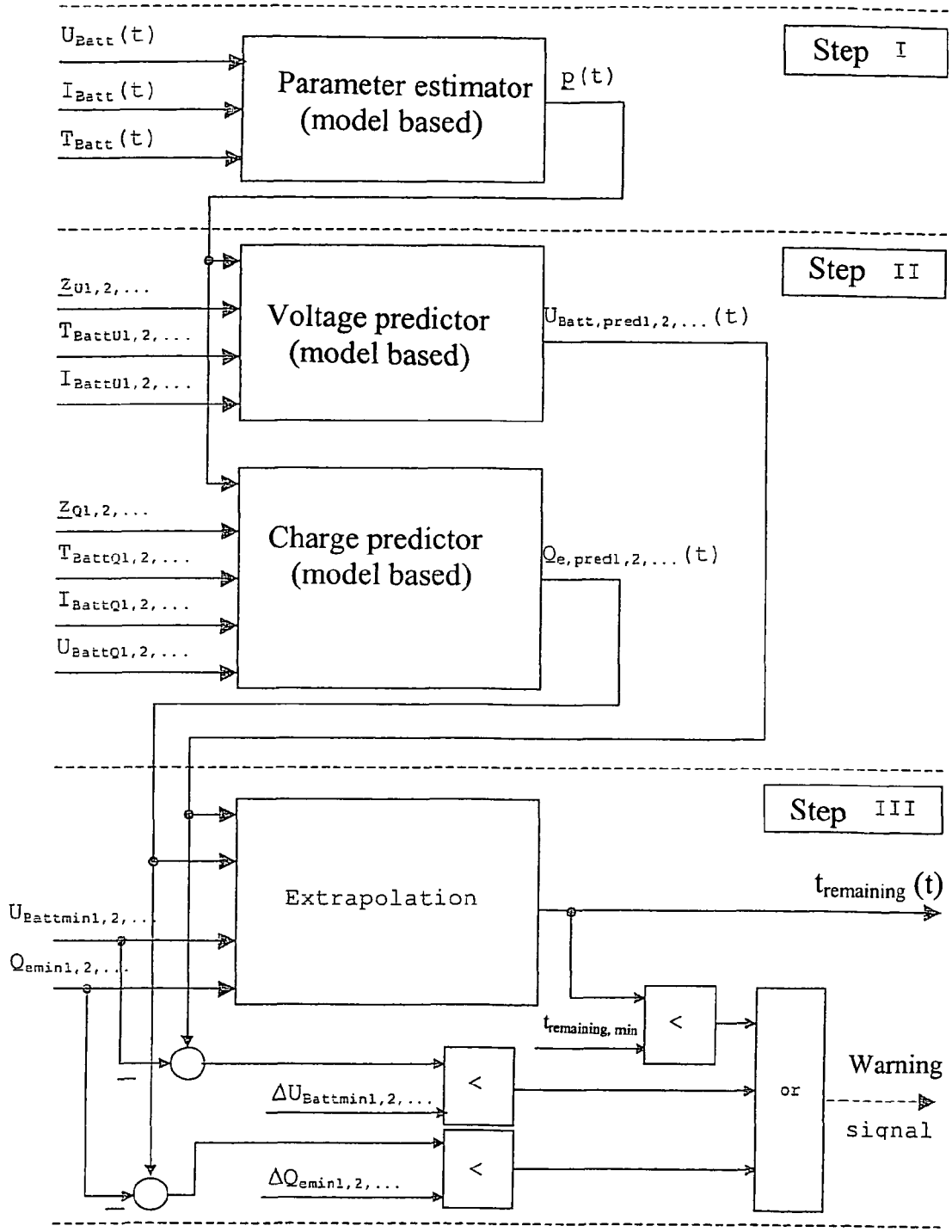
Figure 1: Structure of the lifetime predictor

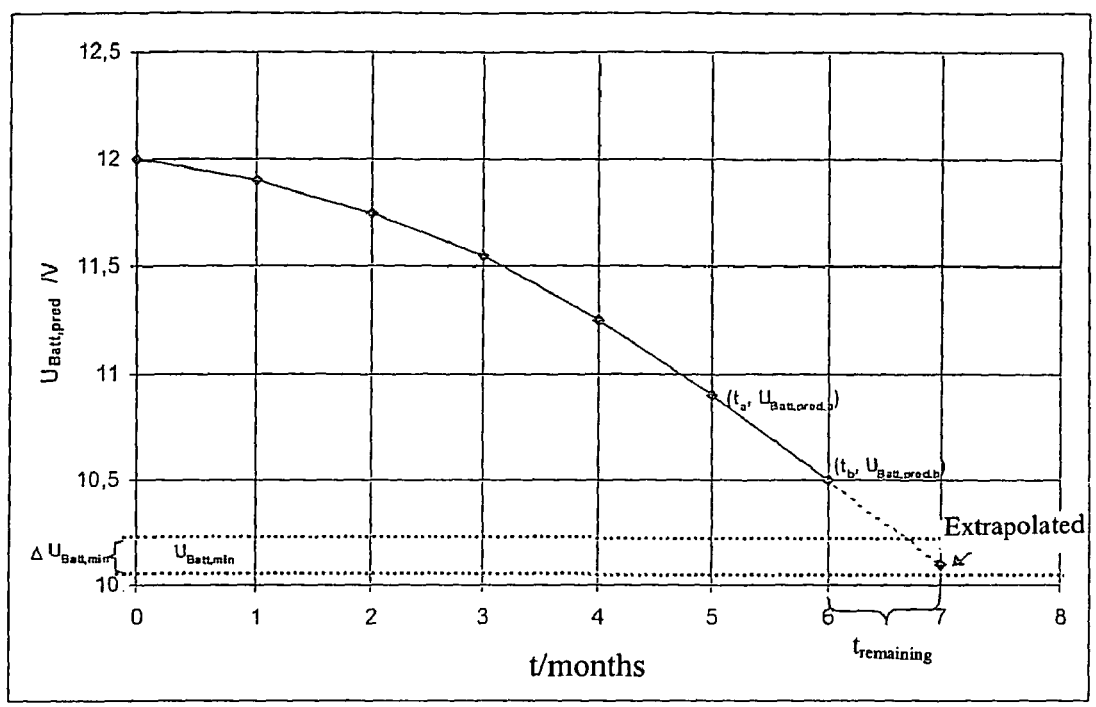
Figure 2: Extrapolation of the example of voltage prediction

METHOD FOR PREDICTING THE RESIDUAL SERVICE LIFE OF AN ELECTRIC ENERGY ACCUMULATOR

FIELD OF THE INVENTION

The present invention relates to a method for predicting the remaining lifetime of an electric energy storage mechanism as well as devices for implementing the methods according to the present invention.

BACKGROUND INFORMATION

With electric energy storage mechanisms such as batteries, it is extremely important to predict the remaining lifetime until they become unusable, in particular in the case of lead batteries in motor vehicles. The battery may be replaced promptly due to a warning to the operator of the vehicle before an imminent battery failure, thereby preventing breakdown of a vehicle or failure of electric devices in the vehicle, in particular those critical for safety, such as x-by-wire systems. However, replacement of batteries too early must be avoided for cost reasons. Therefore, metrics tailored for the particular application and analyzable as accurately as possible are crucial for the useful life of a battery having parameterizable threshold values for a battery replacement display.

Various methods of determining the useful life (SOH=state of health) of energy storage mechanisms, in particular lead batteries such as those used in the automotive field, are known from the literature. One measure used for the state of aging of a battery is the decline in storage capacity in comparison with the new state, which is estimated, e.g., by monitoring such operating conditions as charge conversion, exhaustive battery discharge phases and ambient temperature (U.S. Pat. No. 6,103,408) or from the current and voltage curves in typical recurring load cases (engine start). In addition, the decline in efficiency is used as a measure of aging by observing the voltage dip when starting the engine (German Published Patent Application No. 197 50 309) or the temperature- and charge state-compensated dynamic internal resistance (German Patent No. 37 12 629, German Published Patent Application No. 100 49 495) over the lifetime of a battery.

The prevailing state of health of the energy storage mechanism is thus evaluated either on the basis of the prevailing storage capacity or the efficiency based on engine startup. The literature does not describe or analyze any more detailed criteria for the state of health applicable to different applications including combined applications (engine start, electric or hybrid vehicle, power supply to safety-critical electric consumers, . . . ). Nor is there any prediction of the remaining lifetime.

SUMMARY OF THE INVENTION

By extrapolation with the help of a mathematical model of the energy storage mechanism, in particular an automotive lead battery (e.g., German Published Patent Application No. 103 01 823, German Published Patent Application No. 103 03 506), the present invention determines the remaining lifetime until the levels drop below any preselectable minimum efficiency and/or storage capacity under given boundary conditions for the charge state and temperature. The remaining lifetime and a warning when the battery falls below a preselected threshold are displayed for the driver of the vehicle.

The present invention overcomes the disadvantages of the known methods for determining the state of health of an energy storage mechanism as described in the related art; this is accomplished with the help of a model of the energy storage mechanism, the parameters being adapted continuously to the real values over the lifetime of the device. The anticipated remaining lifetime is determined by extrapolation from the values that are calculated at regular intervals on the basis of the model and stored, i.e., the values for the efficiency and/or storage capacity based on a preselected charge stage (e.g., full charge) and temperature (e.g., cold start temperature −18° C.) and the minimum values required for the particular application.

The advantages in comparison with the related art include the following in particular:

Use of a mathematical model having automatic adaptation to the energy storage mechanism used by continuous adaptation of the parameters of the energy storage model (e.g., important after changing a battery in a vehicle→no engine characteristic maps are required for the aging behavior of the battery used)→more accurate determination of the state of health and remaining lifetime→reduced risk of replacing the battery too early or too late;

Easily parameterizable metrics tailored to the particular application for the state of health of the energy storage mechanism with regard to the storage capacity and/or efficiency→easily applicable to different applications;

Determination of the remaining lifetime by extrapolation of the time curves of the calculated storage capacity and/or efficiency based on a certain charge state and temperature→prompt warning with a rapid drop in storage capacity and/or efficiency, although their absolute values are currently still sufficiently high →e.g., a battery no longer capable of a cold start under winter conditions is detected in the summer and may thus be replaced promptly.

BRIEF DESCRIPTION OF THE DRAWINGS

FIG. 1 shows the basic structure of the method.

FIG. 2 shows an extrapolation of the example of voltage prediction.

DETAILED DESCRIPTION

FIG. 1 shows the basic structure of the method. It is divided into three steps. First, in the first step the parameters of the mathematical energy storage mechanism model summarized by vector p are adapted by a parameter estimator (e.g., Kalman filter according to R.304628) by continuous measurement of the operating parameters, i.e., battery current $I_{Batt}$, battery voltage $U_{Batt}$ and battery temperature $T_{Batt}$. In the case of a lead battery p includes parameters such as internal ohmic resistance, capacitance and diffusion resistance, for example. It is important that these parameters are standardized to a predetermined temperature (e.g., 25° C.) and charge state (full charge), i.e., with a given battery they change only as a result of aging factors.

In the second step, the mathematical battery model used in the voltage and charge predictor is initialized with battery parameters p. The voltage predictor supplies the prevailing efficiency of the battery by predicting, with the help of the battery model, voltage responses $U_{Batt,pred1, 2, \ldots}$ to specified load current profiles $I_{BattU1, 2, \ldots}$ under given boundary conditions for battery variables of state $z_{U1, 2, \ldots}$ and temperature $T_{BattU1, 2, \ldots}$ (see German Published Patent Application No. 103 01 823). Vector $z_{U1, 2, \ldots}$ of the battery parameters of state to be specified of the battery model contains in the case of a lead battery, e.g., parameters such as open-circuit voltage, concentration and breakdown polarization. $I_{BattU1, 2, \ldots}$, $z_{U1, 2, \ldots}$ and $T_{BattU1, 2, \ldots}$ are to be specified as a function of the application of the energy storage mechanism. For example, in the case of a starter battery for $I_{BattU}$ the current profile required by the starter at a cold start temperature of $T_{BattU} = -18°$ C. would be a reasonable specification with $z_U$ corresponding to a fully charged battery.

The charge predictor supplies the prevailing storage capacity of the battery by using the battery model to calculate usable charges $Q_{e,pred1, 2, \ldots}$ for discharge currents $I_{BattQe1, 2, \ldots}$ and temperatures $T_{BattQe1, 2, \ldots}$ starting from specified battery states $z_{Qe1, 2, \ldots}$ until the battery voltage falls below specified values $U_{BattQ1, 2, \ldots}$ (German Published Patent Application No. 103 01 823). For example, when $I_{BattQe} = 120 = K20/20$ h, $T_{BattQe} = 27°$ C., $U_{BattQe} = 10.5$ V, $z_{Qe} =$ full charge, the charge predictor indicates the currently usable charge of a starter battery of nominal capacity K20 under nominal conditions.

Using the charge predictor, combined requirements of the energy storage mechanism with regard to storage capacity and efficiency may also be analyzed. To do so, discharge current profile $I_{BattQe}$ is expanded by a load current profile according to those used for predicting voltage and the minimum allowed battery voltage under load with the specific load current profile is used for $U_{BattQ}$ (see German Published Patent Application No. 103 01 823). In the case of a starter battery, for example, it is thus possible to calculate the amount of reserve charge at a full charge, a specified discharge current and a temperature up to the startability limit.

In step III, the time characteristics of voltages $U_{Batt,pred1, 2, \ldots}$ and usable charges $Q_{e,pred1, 2, \ldots}$ calculated by the voltage and charge predictor are stored, and the period of time $t_{remaining}$ until at least one of these parameters drops below its respective specified minimum level $U_{Battmin1, 2, \ldots}$ and/or $Q_{emin1, 2, \ldots}$ is calculated by extrapolation (see FIG. 2). Specified minimum values $U_{Battmin1, 2, \ldots}$ and/or $Q_{emin1, 2, \ldots}$ characterize the limit until the battery becomes unusable with respect to the particular requirements of its storage capacity and/or efficiency.

In the simplest case the extrapolation may be performed linearly from the last two time-voltage value pairs and/or time-charge value pairs saved at times $t_a$, $t_b$:

$$t_{remaining,U} = (t_b - t_a) * (U_{Battmin} - U_{Batt,predb}) / (U_{Batt,predb} - U_{Batt,preda})$$

and $$t_{remaining,Q} = (t_b - t_a) * (Q_{emin} - Q_{e,predb}) / (Q_{e,predb} - Q_{e,preda})$$

In the case of multiple specifications for the storage capacity and/or efficiency, resulting remaining lifetime $t_{remaining}$ is determined by forming the minimum of individual values $t_{remaining,U1, 2, \ldots}$ and $t_{remaining,Q1, 2, \ldots}$:

$$t_{remaining} = \min(t_{remainingU1}, \ldots, t_{remainingU2}, \ldots, t_{remainingQ1}, t_{remainingQ2}, \ldots).$$

For more detailed determination of remaining lifetime $t_{remaining}$ the extrapolation may also be performed with more than two time-voltage value pairs and/or time-charge value pairs and more complex methods such as linear regression or in the case of nonlinear curves by using polynomials or methods based on neural networks (RBF). Furthermore, extrapolation procedures may be derived from curves already measured and thus known for storage capacity and/or efficiency over the lifetime of the battery.

When the remaining lifetime falls below a specified minimum $t_{remaining,min}$, an optical and/or acoustic warning signal is output to the driver, calling for replacement of the battery.

In the case of time curves of the predicted voltage or usable charge having a shallow descent or even a rise and being close to the specified minimum levels, falling below a specified minimum distance between prevailing predicted voltage and/or usable charge and the particular minimum value is supplemented as an additional replacement criterion to avoid a battery replacement warning coming too late:

Warning signal = $(t_{remaining} < t_{remaining,min})$ or ...
$(U_{Batt,pred1, 2, \ldots} - U_{Battmin1, 2, \ldots}) < \Delta U_{Battmin1, 2, \ldots}$ or ...
$(Q_{e,pred1, 2, \ldots} - Q_{emin1, 2, \ldots}) < \Delta Q_{emin1, 2, \ldots}$.

What is claimed is:

1. A method for predicting a remaining lifetime of an electric energy storage mechanism, the method comprising:
   adapting continuously a parameter of a mathematical model of the energy storage mechanism to a real value over the lifetime of the energy storage mechanism;
   adapting the mathematical model with the adapted parameter; performing extrapolation via the mathematical model;
   determining at regular intervals the remaining lifetime based on the extrapolation, wherein the mathematical model is adapted with the adapted parameter between the regular intervals, and wherein the remaining lifetime is defined as a time until reaching any definable limiting values for one of a minimum efficiency and a minimum storage capacity;
   indicating the remaining lifetime; and
   when a level falls below a preselectable threshold for the remaining lifetime, providing a warning.

2. The method as recited in claim 1, further comprising:
   calculating and storing at least one of a value for an efficiency of the energy storage mechanism and a value for a storage capacity of the energy storage mechanism at regular intervals on the basis of the mathematical model.

3. The method as recited in claim 2, wherein the at least one of the value for the efficiency of the energy storage mechanism and the value for the storage capacity of the energy storage mechanism are based on at least one of a specifiable charge state and a temperature.

4. The method as recited in claim 3, wherein the remaining lifetime is determined by extrapolation from the at least one of the value for the efficiency of the energy storage mechanism and the value for the storage capacity of the energy storage mechanism and from a minimum value required for a particular application.

5. A device for predicting a remaining lifetime of an electric energy storage mechanism, comprising:
   a display;
   a memory; and
   a processor, wherein the processor is programmed to perform the following:
      adapting continuously a parameter of a mathematical model of the energy storage mechanism to a real value over the lifetime of the energy storage mechanism;
      adapting the mathematical model with the adapted parameter;
      performing extrapolation via the mathematical model;
      determining at regular intervals the remaining lifetime based on the extrapolation, wherein the mathematical model is adapted with the adapted parameter between the regular intervals, and wherein the remaining lifetime is defined as a time until reaching any definable limiting values for one of a minimum efficiency and a minimum storage capacity;
      indicating the remaining lifetime; and
      when a level falls below a preselectable threshold for the remaining lifetime, providing a warning.

6. The method as recited in claim 1, wherein the electric energy storage mechanism includes a battery in a motor vehicle.

7. The method as recited in claim 2, further comprising:
providing a warning when a level falls below a preselectable threshold for at least one of the efficiency of the energy storage mechanism and the storage capacity of the energy storage mechanism.

8. The device as recited in claim 5, wherein at least one of a value for an efficiency of the energy storage mechanism and a value for a storage capacity of the energy storage mechanism at regular intervals is determined based on the mathematical model and stored, wherein the at least one of the value for the efficiency of the energy storage mechanism and the value for the storage capacity of the energy storage mechanism are based on at least one of a specifiable charge state and a temperature, and wherein the remaining lifetime is determined by extrapolation from the at least one of the value for the efficiency of the energy storage mechanism and the value for the storage capacity of the energy storage mechanism and from a minimum value required for a particular application.

9. The method as recited in claim 1, further comprising:
calculating and storing at least one of a value for an efficiency of the energy storage mechanism and a value for a storage capacity of the energy storage mechanism at regular intervals on the basis of the mathematical model; and
providing a warning when a level falls below a preselectable threshold for at least one of the efficiency of the energy storage mechanism and the storage capacity of the energy storage mechanism;
wherein the at least one of the value for the efficiency of the energy storage mechanism and the value for the storage capacity of the energy storage mechanism are based on at least one of a specifiable charge state and a temperature,
wherein the remaining lifetime is determined by extrapolation from the at least one of the value for the efficiency of the energy storage mechanism and the value for the storage capacity of the energy storage mechanism and from a minimum value required for a particular application, and
wherein the electric energy storage mechanism includes a battery in a motor vehicle.

* * * * *